United States Patent [19]
Sago

[11] Patent Number: 6,094,379
[45] Date of Patent: Jul. 25, 2000

[54] MEMORY READING CIRCUIT AND SRAM

[75] Inventor: Tomoe Sago, Tokyo, Japan

[73] Assignee: NEC Corporation, Tokyo, Japan

[21] Appl. No.: 09/252,827

[22] Filed: Feb. 19, 1999

[30] Foreign Application Priority Data

Feb. 19, 1998 [JP] Japan ................................. 10-037250

[51] Int. Cl.$^7$ .................................................. G11C 7/00
[52] U.S. Cl. ......................... 365/190; 365/191; 365/194; 365/230.06
[58] Field of Search .................................. 365/190, 194, 365/191, 233, 230.06, 233.5, 196

[56] References Cited

U.S. PATENT DOCUMENTS

| | | | |
|---|---|---|---|
| 5,479,374 | 12/1995 | Kobayashi et al. ...................... | 365/190 |
| 5,668,769 | 9/1997 | Coffman et al. ......................... | 365/194 |
| 5,719,812 | 2/1998 | Seki et al. ............................... | 365/194 |
| 5,798,974 | 8/1998 | Yamagata ................................ | 365/194 |
| 5,808,959 | 9/1998 | Kengeri et al. .......................... | 365/233 |

FOREIGN PATENT DOCUMENTS

9-231767 9/1997 Japan .

*Primary Examiner*—Son T. Dinh
*Attorney, Agent, or Firm*—Foley & Lardner

[57] ABSTRACT

An SRAM comprises a memory cell array composed of a number of SRAM cells arranged in the form of a matrix, and a memory reading circuit including a sense amplifier for differentially amplifying a potential difference between a pair of complementary bit lines, for reading data from the memory cell array. The memory reading circuit includes a delay circuit for making the timing of a signal for deactivating a word line activating the SRAM cells on the same line and the timing of a signal for enabling the sense amplifier, consistent with each other. The delay circuit includes a number of cascade-connected inverters, and the number of the cascade-connected inverters can be adjusted by a focused ion beam. Thus, the reduction of the power consumption and the elevation of the reading speed, which are conventionally considered to be factors incompatible with each other, can be simultaneously realized by optimizing the number of the cascade-connected inverters in the delay circuit.

23 Claims, 7 Drawing Sheets

MEMORY READING CIRCUIT AND SRAM

BACKGROUND OF THE INVENTION

1. Field of the Invention

The present invention relates to a memory reading circuit, and more specifically to a memory reading circuit for an SRAM (static random access memory) and an SRAM having a memory reading circuit.

2. Description of Related Art

Recently, development of a micro-miniaturization of semiconductor devices is remarkable, and in the SRAM formed of semiconductor devices, a low power consumption and a high speed operation are demanded. In a read/write operation proportion of the SRAM, the reading operation generally occupies 70% to 80% of the whole operation. Therefore, in order to reduce the power consumption in the SRAM, it is effective to reduce the power consumption in the reading operation. On the other hand, the factor determining the operation speed of the SRAM is an access time in the reading operation. Therefore, in order to speed up the operation of the SRAM, it is necessary to reduce the access time in the reading operation.

One technology for speeding up the reading operation of the SRAM is disclosed in Japanese Patent Application Pre-examination Publication No JP-A-09-231767, (an English abstract of JP-A-09-231767 is available and the content of the English abstract of JP-A-09-231767 is incorporated by reference in its entirety into this application). This prior art describes a method for controlling the generating timing of a signal for enabling a sense amplifier by the number of gates. However, this prior art does not touch the reduction of the power consumption.

Figure 1:
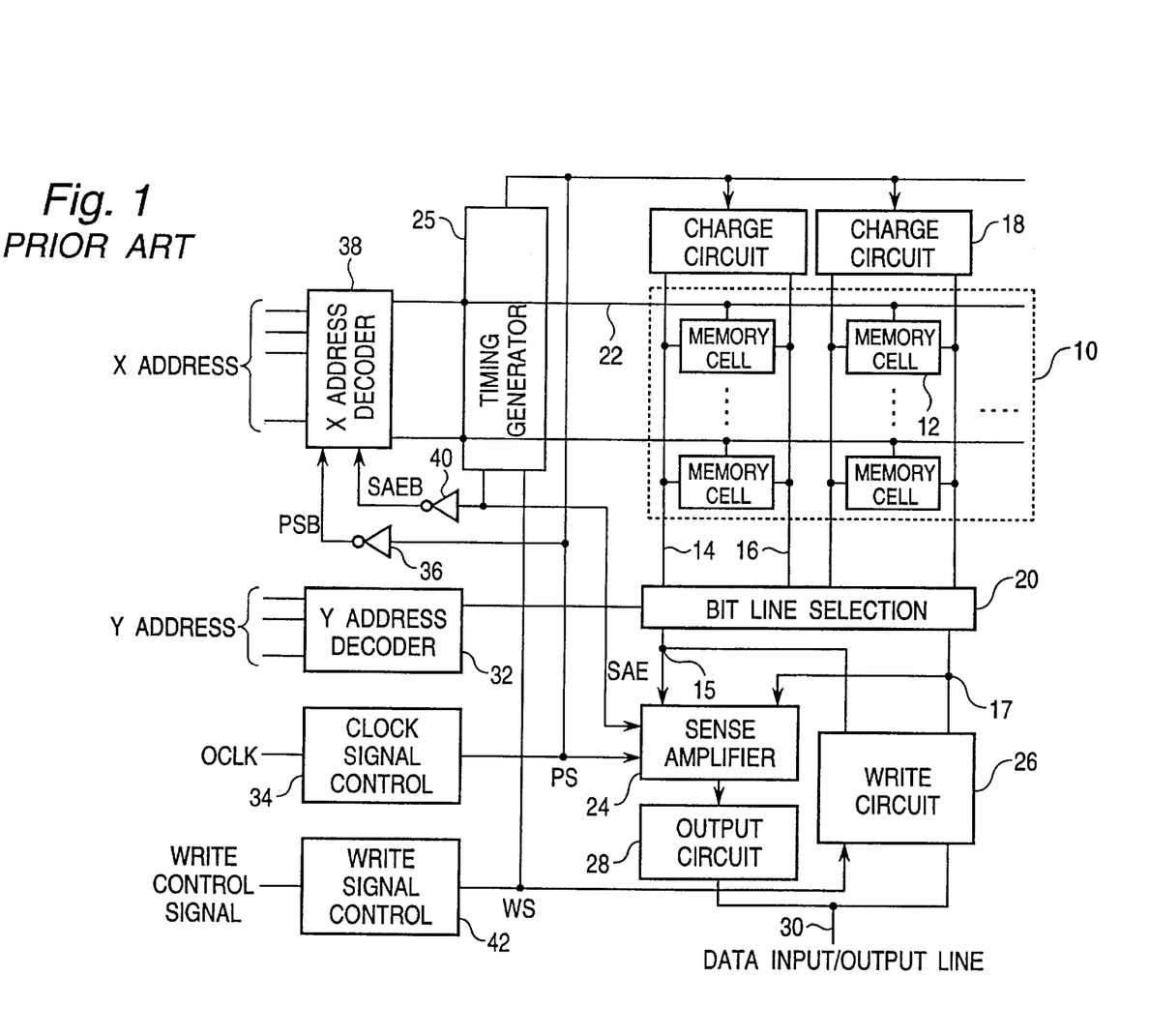
FIG. 1 is a block diagram illustrating the construction of a conventional SRAM for making it easier to understand the present invention which will be described later.

Referring to FIG. 1, there is shown a block diagram illustrating the construction of a conventional SRAM for making it easier to understand the present invention which will be described later.

The SRAM shown in FIG. 1 is a synchronous SRAM, and includes a memory cell array 10 composed of a number of memory cells 12 arranged in the form of an X-Y matrix. Each of the memory cells 12 is connected, in units of a Y direction column, to a bit line charge circuit 18 and a bit line selection circuit 20 through a pair of complementary bit lines 14 and 16. In addition, the memory cells on the same line in an X direction are connected through a corresponding word line 22 to a sense amplifier activation timing generator 25, which is connected to an X address decoder 38. The bit line selection circuit 20 is connected to a sense amplifier 24 and a write circuit 26, and the sense amplifier 24 is connected to an output circuit 28. The output circuit 28 and the write circuit 26 are connected to a data input/output line 30.

The bit line selection circuit 20 is also connected to a Y address decoder 32. A clock signal control circuit 34 is connected to supply a precharge signal PS to the sense amplifier 24, the sense amplifier activation timing generator 25, and the bit line charge circuits 18, and the precharge signal PS is also supplied through an inverter 36 to the X address decoder 38. The sense amplifier activation timing generator 25 is connected to supply a sense amplifier enabling signal SAE to the sense amplifier 24, and the sense amplifier enabling signal SAE is also supplied through an inverter 40 to the X address decoder 38. A write control circuit 42 is connected to supply a write signal WS to the sense amplifier activation timing generator 25 and the write circuit 26.

Figure 2:
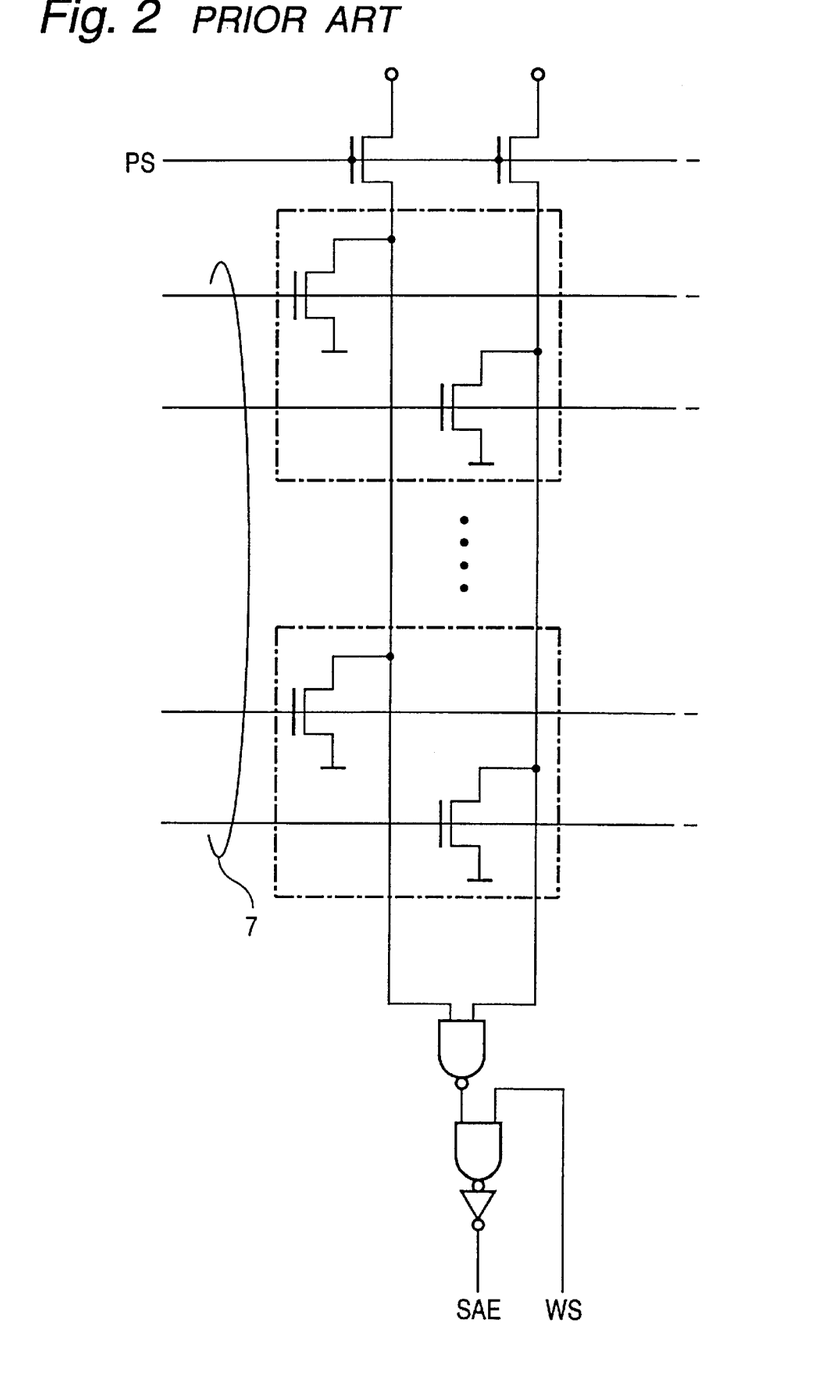
FIG. 2 is a circuit diagram illustrating the construction of the sense amplifier activation timing generator included in the conventional SRAM shown in FIG. 1.

Referring to FIG. 2, there is shown a circuit diagram illustrating the construction of the sense amplifier activation timing generator 25. The sense amplifier activation timing generator 25 is constituted of MOS transistors, NAND gates, etc. This sense amplifier activation timing generator 25 generates the signal SAE for enabling the sense amplifier and a signal SAEB for deactivating the word line.

Figure 3:
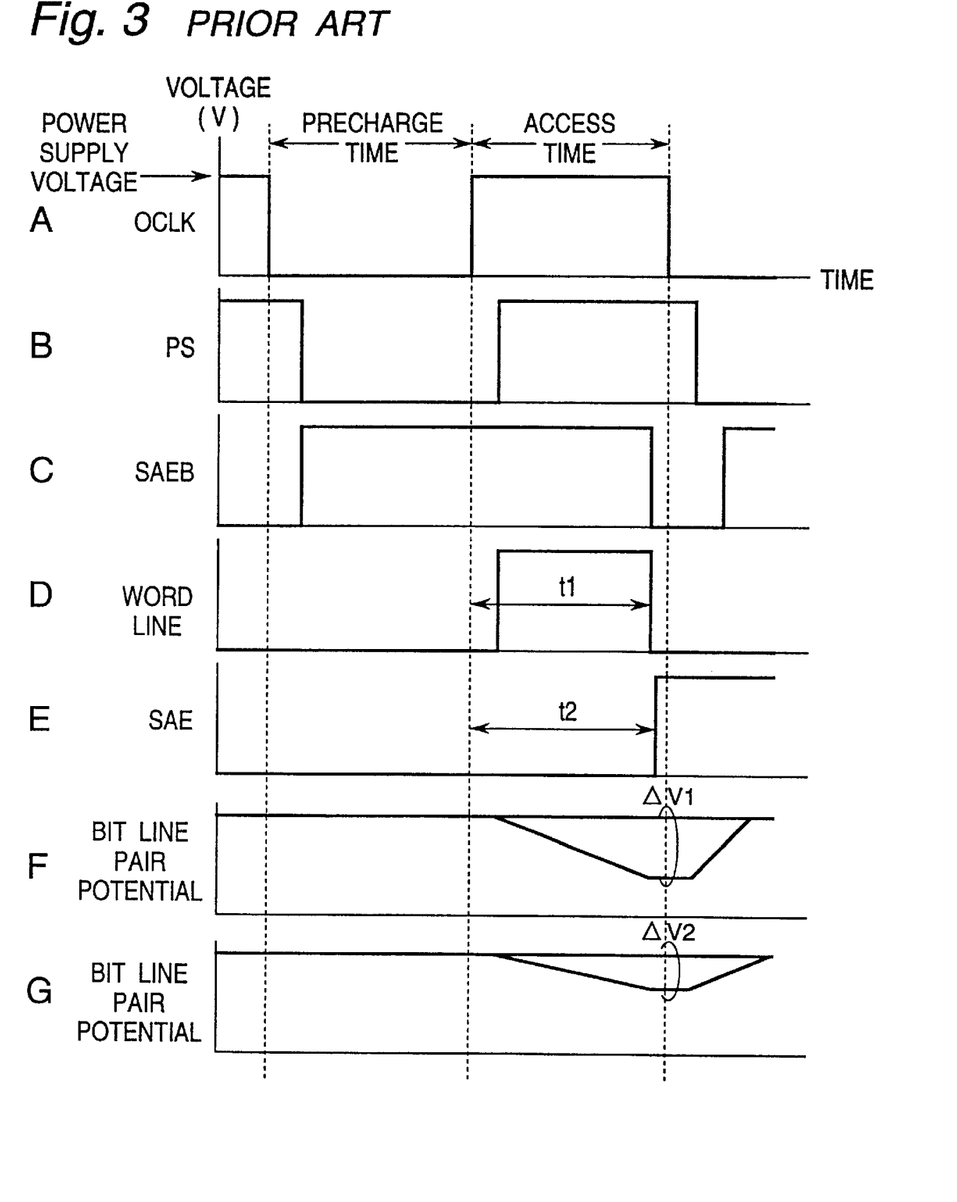
FIG. 3 is a timing chart for illustrating the reading operation of the conventional SRAM shown in FIG. 1.

Now, a reading operation of the SRAM shown in FIG. 1 will be described with reference to a timing chart of FIG. 3 illustrating the reading operation. In FIG. 3, "A" indicates an external clock signal OCLK, and "B" shows the precharge signal PS. "C" indicates the signal SAEB for deactivating the word line (in the reading time), and "D" shows a period in which the word line is active. "E" indicates the signal SAE for enabling the sense amplifier. "F" shows the potential of the complementary bit line pair 14 and 16, and "G" indicates the potential of a complementary bit line pair 15 and 17 outputted from the bit line selection circuit 20.

The clock signal control circuit 34 generates, on the basis of the external clock OCLK, the precharge signal PS having a phase delayed from the external clock OCLK. On the other hand, an X address and a Y address are decoded by the X address decoder 38 and the Y address decoder 32. The sense amplifier activation timing generator 25 generates the signal SAE for enabling the sense amplifier. This signal SAE is inverted by the inverter 40, and the inverted signal SAEB is supplied to the X address decoder 38 for deactivating the word line 22 which is an X row selection line for activating the memory cells on the same line. The precharge signal PS is inverted by the inverter 36, and the inverted signal PSB (not shown in FIG. 3) is supplied to the X address decoder 38.

With a falling of the precharge signal PS, the bit line charge circuit 18 precharges the complementary bit line pair 14 and 16, and thereafter, with a falling of the signal PSB, the word line 22 is activated, so that the memory cell is selected. The selected memory cell begins to discharge, so that a potential difference is generated between the pair of complementary bit lines 14 and 16. On the other hand, with a rising of the precharge signal PS, the sense amplifier activation timing generator 25 starts the discharge operation, so that the signal SAE becomes a high level after a delay time determined by the dimension (gate width) of the transistors included in the sense amplifier activation timing generator 25 shown in FIG. 2 In response to the high level of the signal SAE, the sense amplifier 24 operates. With a falling of the signal SAEB, the word line 22 is brought to a low level, so that the selection of the memory cell to be read is completed.

In the timing chart "D" in FIG. 3, the timing for deactivating the word line is indicated by a time $t_1$ counted from the rising of the external clock signal OCLK, and in the timing chart "E" in FIG. 3, the timing for bringing the signal SAE to the high level is indicated by a time $t_2$ counted from the rising of the external clock signal OCLK. These times $t_1$ and $t_2$ are determined by the delay time which is determined by the gate width of the transistors included in the sense amplifier activation timing generator 25, as mentioned above.

The timing where the sense amplifier 24 operates, is determined to be later than a time that a potential swing amplitude $\Delta V1$ on the complementary bit line pair 14 and 16 connected to the selected memory cell to be read (the potential difference between the pair of complementary bit lines 14 and 16), namely, the potential swing amplitude $\Delta V2$ on the complementary bit line pair 15 and 17 (the potential difference between the pair of complementary bit lines 15 and 17) outputted from the bit line selection circuit 20 in the circuit shown in FIG. 1, becomes higher than a minimum operating voltage of the sense amplifier 24.

In the power consumption of the prior art SRAM shown in FIG. 1, the power consumed by the memory cell array is dominant. Considering the SRAM of 512 W×16 bit as an example, about 50% of the whole power consumption in the reading operation is the power consumed by the memory cell array, and the remaining 50% is consumed by and the other circuits including the decoder, the sense amplifier and the output circuit. Specifically, the power consumption of the memory cell array is mainly attributable to the charging current and the discharging current of the bit line pairs. Generally, the charging current and the discharging current is determined by the following equation:

$$I = f \times c \times \Delta V$$

where "f" is an operating frequency, "c" is a bit line load capacitance, and "$\Delta V$" is a potential swing amplitude.

Here, assuming that the swing amplitude of the potential in the bit line pair is $\Delta V1$ and the number of the memory cells arranged in the X direction (word line direction) is n, when the word line is activated, all the memory cells on the same line are driven, so that the potential difference is generated in the "n" bit line pairs. Therefore, a total $\Delta V$ is expressed as follows:

$$\Delta V = n \times \Delta V1$$

Accordingly, the current $I_{cell}$ of the memory cell array is expressed as follows:

$$I_{cell} = f \times c \times n \times \Delta V1$$

Therefore, assuming that the frequency "f" and the load capacitance "c" are constant, if the potential swing amplitude $\Delta V1$ in the bit line pair becomes "m" times, the current of the memory cell also becomes "m" times. Accordingly, the power consumption in the memory cell array depends upon the potential swing amplitude $\Delta V1$ in the bit line pair.

On the other hand, the reading speed of the SRAM depends upon the output timing of the signal SAE. In the construction of the prior art SRAM shown in FIG. 1, the timing for operating the sense amplifier is determined by the construction of the sense amplifier activation timing generator and the gate width of the transistors included in the sense amplifier activation timing generator.

In the above mentioned prior art SRAM, the following problems have been encountered.

(1) In the SRAM (particularly, the SRAM disclosed in JP-A-09-231767), the speed-up of the reading operation and the reduction of the power consumption cannot be simultaneously realized.

(2) Since the gate width of the transistors included in the sense amplifier activation timing generator is determined by a diffusion process in a manufacturing process, an optimum design is difficult in the SRAM designing.

(3) Similarly, since the gate width of the transistors included in the sense amplifier activation timing generator is determined by a diffusion process in a manufacturing process, a feedback obtained from the evaluation on an actual chip needs a considerable time in the SRAM designing, and therefore, a long TAT (development time) is required.

SUMMARY OF THE INVENTION

Accordingly, it is an object of the present invention to provide a memory reading circuit which can easily adjust and optimize the incompatible important factors in the memory design, such as the reduction of the power consumption and the speed-up of the operation, by changing the number of gates in a delay circuit.

Another object of the present invention is to provide a memory reading circuit capable of shortening the development time of the SRAM.

Still another object of the present invention is to provide an SRAM having the memory reading circuit mentioned above.

As mentioned above, the power consumption attributable to the memory cell array is dominant in the power consumption of the SRAM. The power consumption of the memory cell array is mainly determined by the potential swing amplitude in the bit line pair, as mentioned above. This potential swing amplitude in the bit line pair (actually, the potential swing amplitude in the bit line pair outputted through transfer gates of the bit line selection circuit) may be a minimum value enough to fulfill the sense amplifier operating condition in the case that the sense amplifier is of a differential voltage operating type. Furthermore, if the timing for operating the sense amplifier is met with a minimum time where the potential swing amplitude in the bit line pair fulfills the sense amplifier operating condition, the reading speed can be correspondingly elevated. In view of these matters, the reduction of the power consumption and the elevation of the reading speed, which are conventionally considered to be factors incompatible with each other, can be simultaneously realized by optimizing the potential swing amplitude in the bit line pair from the viewpoint of the sense amplifier operation.

Specifically, the following conditions are considered for optimizing the delay time.

(1) Assuming that $\Delta Vmin$ is a minimum value of the potential swing amplitude in the bit line pair, required to cause the sense amplifier to operate, a delayed inverted signal DPSB of the precharge signal PS is generated by a delay circuit to the effect that $\Delta V2 = \Delta Vmin$ is satisfied in the falling of the word line in the SRAM reading operation; and (2) The delay circuit is designed to make the timing of the falling of the word line and the timing of the activation of the sense amplifier (namely, the rising of the signal SAE) consistent with each other in the reading operation, namely, $t_1 = t_2$.

Figure 4:
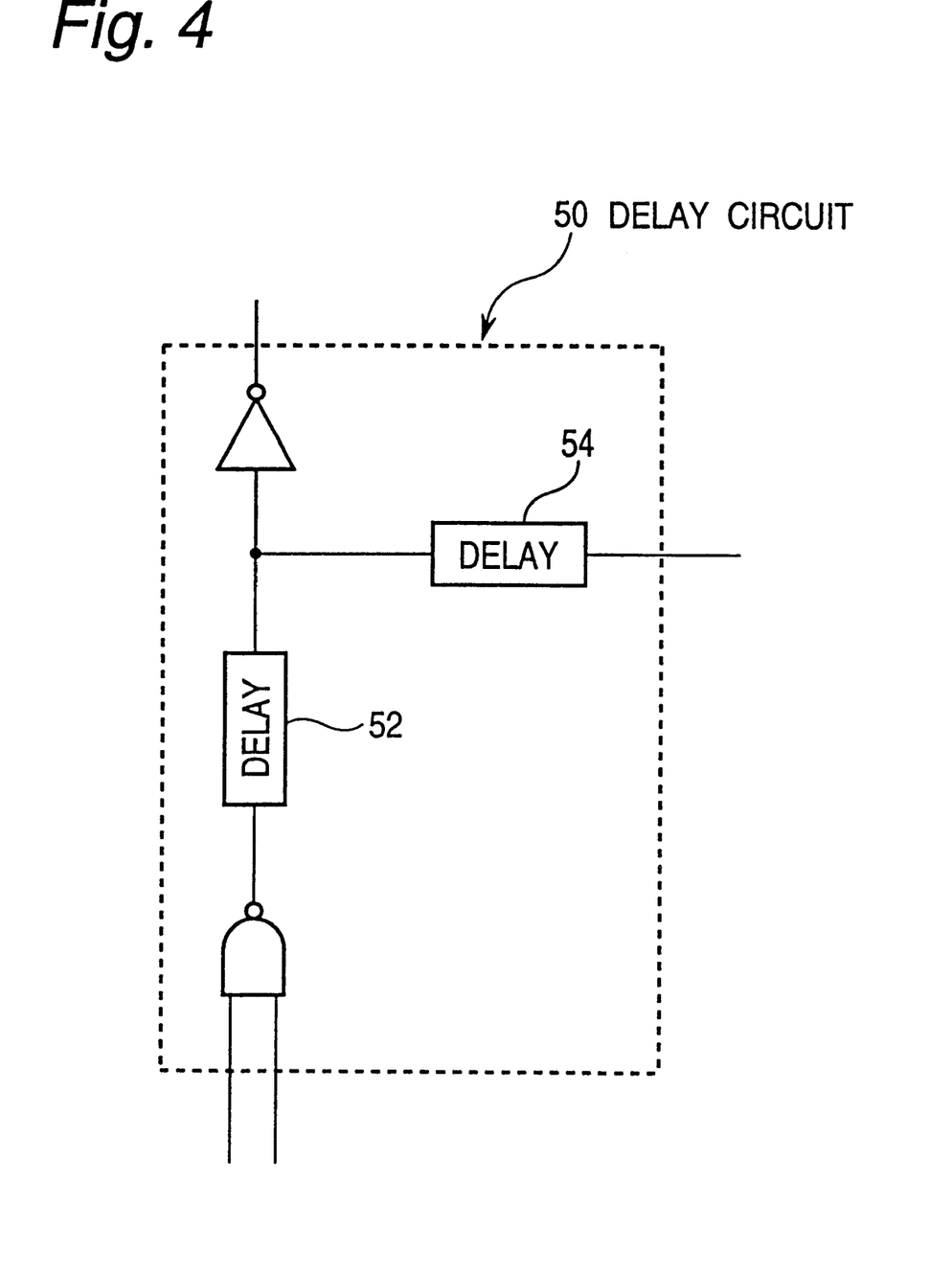
FIG. 4 is a circuit diagram illustrating a modeling of the delay circuit in the memory reading circuit in accordance with the present invention.

In order to realize the above mentioned optimizing condition, the delay circuit is modeled as shown in FIG. 4. The delay circuit 50 includes a first delay circuit 52 and a second delay circuit 54. The number of gates in the first delay circuit 52 and the number of gates in the second delay circuit 54 are determined to make the timing of the falling of the signal DPSB determining the off timing of the word line and the timing of the rising of the signal SAE, consistent with each other, in order to fulfill the optimizing condition (2).

With this two stage construction of the delay circuit, by adjusting the number of gates in the first delay circuit 52, it is possible to adjust $\Delta V2$ while maintaining the simultaneity of the falling timing of the word line and the rising time of the signal SAE. In addition, a fine adjustment of these timings, which becomes necessary because of an error between simulation and an actual chip, can be realized by adjusting the number of gates in the second delay circuit 54.

The above and other objects of the present invention are achieved in accordance with the present invention by a memory reading circuit for reading data from a memory cell array composed of a number of SRAM cells arranged in the form of a matrix, by means of a sense amplifier for differentially amplifying a potential swing amplitude between a pair of complementary bit lines, wherein the memory reading circuit generates a signal for deactivating a word line activating the SRAM cells on the same line and a signal for enabling the sense amplifier, on the basis of the same reference signal.

According to another aspect of the present invention, there is provided an SRAM comprising a memory cell array composed of a number of SRAM cells arranged in the form of a matrix, and a memory reading circuit including a sense amplifier for differentially amplifying a potential swing amplitude between a pair of complementary bit lines, for reading data from the memory cell array, wherein the memory reading circuit generates a signal for deactivating a word line activating the SRAM cells on the same line and a signal for enabling the sense amplifier, on the basis of the same reference signal.

The above and other objects, features and advantages of the present invention will be apparent from the following description of preferred embodiments of the invention with reference to the accompanying drawings.

DESCRIPTION OF THE PREFERRED EMBODIMENT

Figure 5:
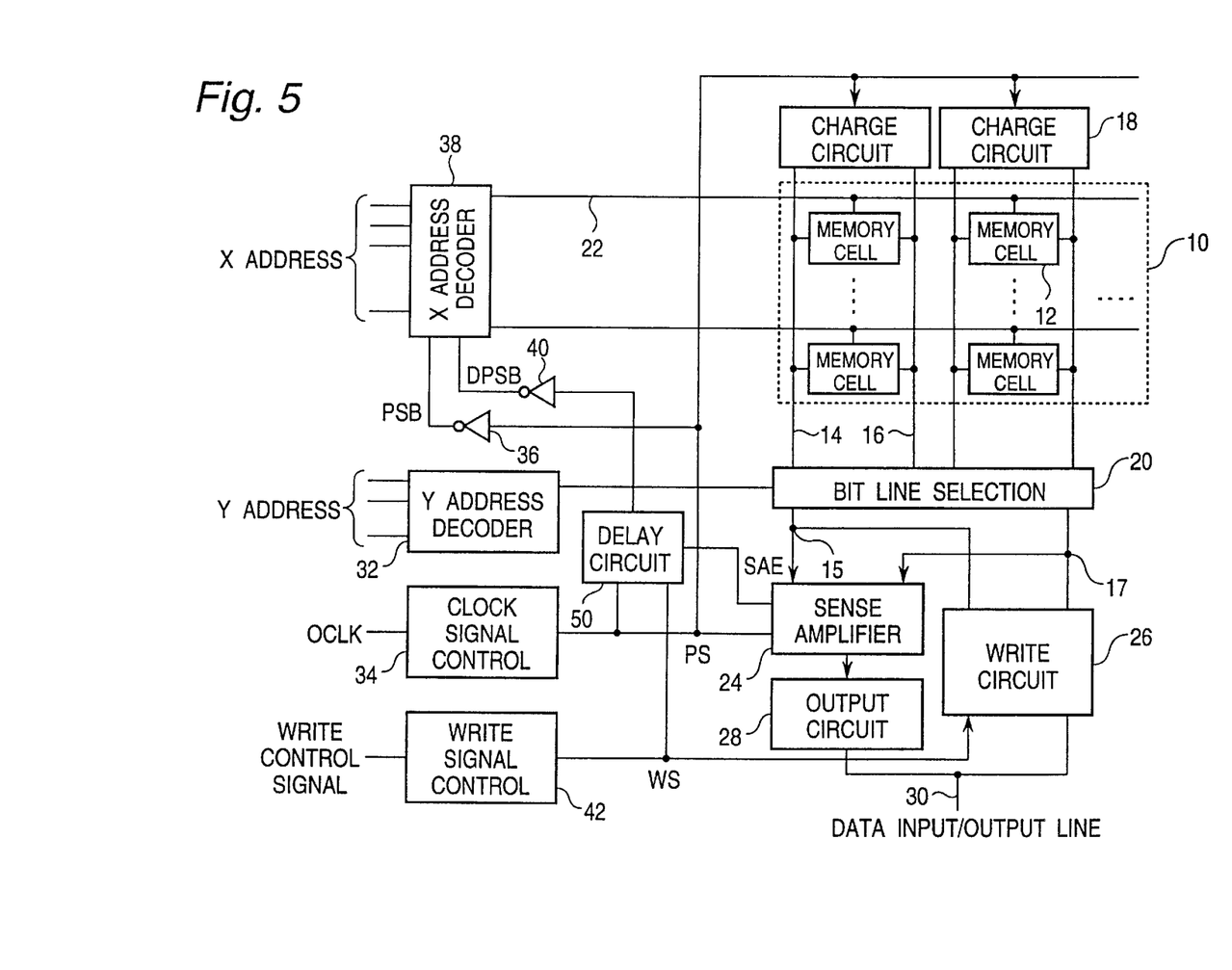
FIG. 5 is a block diagram illustrating the construction of one embodiment of the SRAM in accordance with the present invention.

Referring to FIG. 5, there is shown a block diagram illustrating the construction of one embodiment of the SRAM in accordance with the present invention. In FIG. 5, elements corresponding to those shown in FIG. 1 are given the same Reference Numerals, and explanation thereof will be omitted for simplification of description.

As seen from comparison between FIG. 1 and FIG. 5, the SRAM shown in FIG. 5 is different from the prior art SRAM shown in FIG. 1, only in that the sense amplifier activation timing generator is removed, and there are newly added a signal SAE for enabling the sense amplifier (in the reading operation) and a delay circuit 50 for generating a signal for deactivating the word line (in the reading operation).

Figure 6:
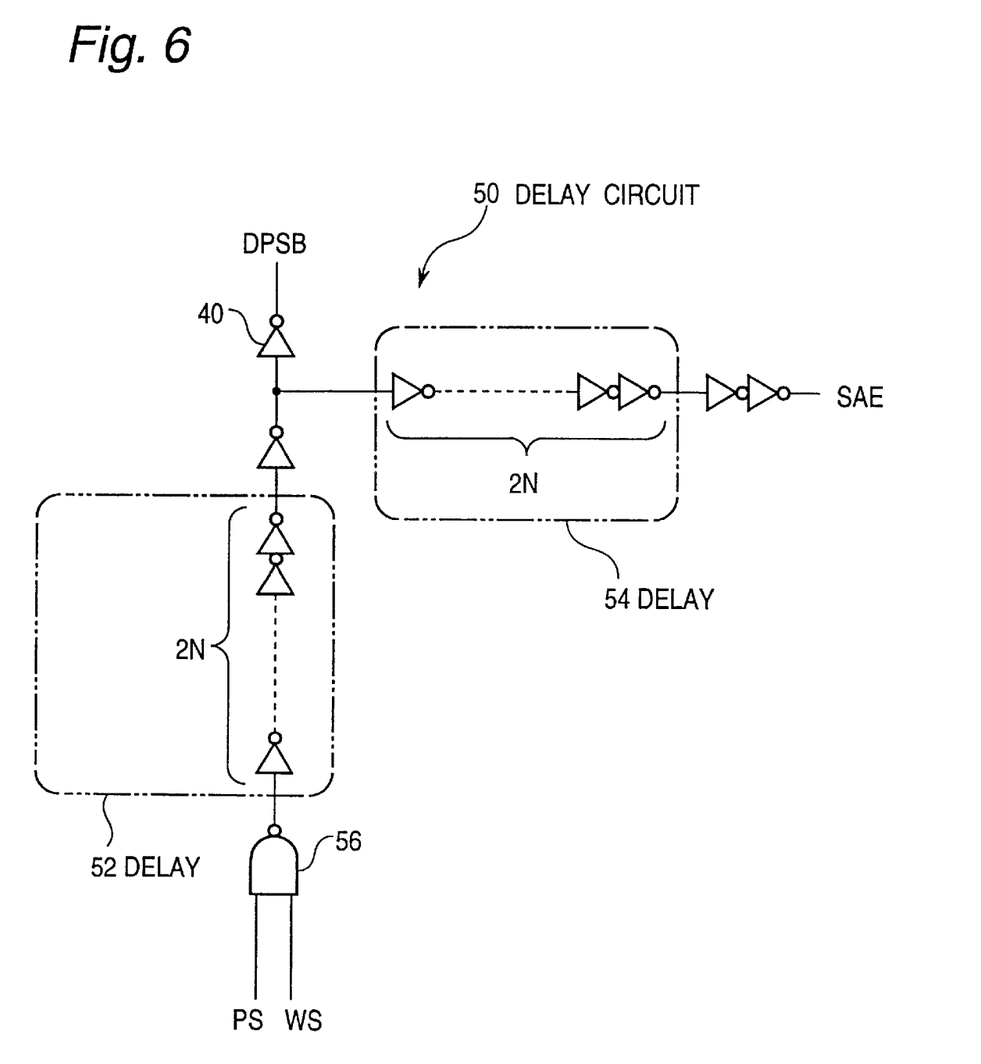
FIG. 6 is a circuit diagram illustrating the construction of the delay circuit in the SRAM in accordance with the present invention.

FIG. 6 is a circuit diagram illustrating the construction of the delay circuit 50, which corresponds to the delay circuit shown in FIG. 4. This delay circuit 50 includes a first delay circuit 52 and a second delay circuit 54. Each of the first delay circuit 52 and the second delay circuit 54 is constituted of 2N inverters cascade-connected by an aluminum interconnection, where "N" is a positive integer. The inverter 40 is included in the delay circuit 50, but is depicted in the outside of the delay circuit 50 in FIG. 6, for convenience in order to clarify a complementary relation of signals.

Since the inverters included in each of the first delay circuit 52 and the second delay circuit 54 are cascade-connected by the aluminum interconnection, the number of inverters used for constituting the delay circuit can be changed on the chip, at the time of the actual chip evaluation, by disconnecting and connecting the aluminum interconnection by means of a selective etching and a selective metal deposition by a focused ion beam.

By changing the number of inverters, it is possible to freely set the delay time of each of the delay circuits 52 and 54. Firstly, the delay times are set to make the falling timing of the word line and the rising timing of the signal SAE consistent with each other ($t_1=t_2$). Secondly, the delay times are set to generate the signal DPSB which ensures that $\Delta V2=\Delta Vmin$ is fulfilled at the falling timing of the word line in the SRAM reading operation.

An NAND gate 56 having an output connected to an input of the first delay circuit 52 receives the precharge signal PS from the clock signal control circuit 34 and the write signal WS from the write control circuit 42. An output of the first delay circuit 52 is supplied through the inverter 40 to the X address decoder 38 as the signal DPSB. The output of the first delay circuit 52 is further connected to an input of the second delay circuit 54, and an output of the second delay circuit 54 is outputted as the signal SAE for enabling the sense amplifier 24.

Now, an operation of the SRAM shown in FIG. 5 will be described with reference to the timing chart of FIG. 7 for illustrating the reading operation of the SRAM in accordance with the present invention. The timing charts "A" to "G" in FIG. 7 correspond to the timing charts "A" to "G" shown in FIG. 3, respectively. However, the timing charts "C" and "E" in FIG. 7 indicate the signals generated by the delay circuit 50.

In the SRAM reading operation, the X address decoder 38 receives the signal PSB obtained by inverting the precharge signal PS outputted from the clock signal control circuit 34 by means of the inverter 36, and the delayed signal DPSB outputted from the inverter 40 of the delay circuit 50. The signal SAE for enabling the sense amplifier is outputted from the delay circuit 50 to the sense amplifier 24.

Figure 7:
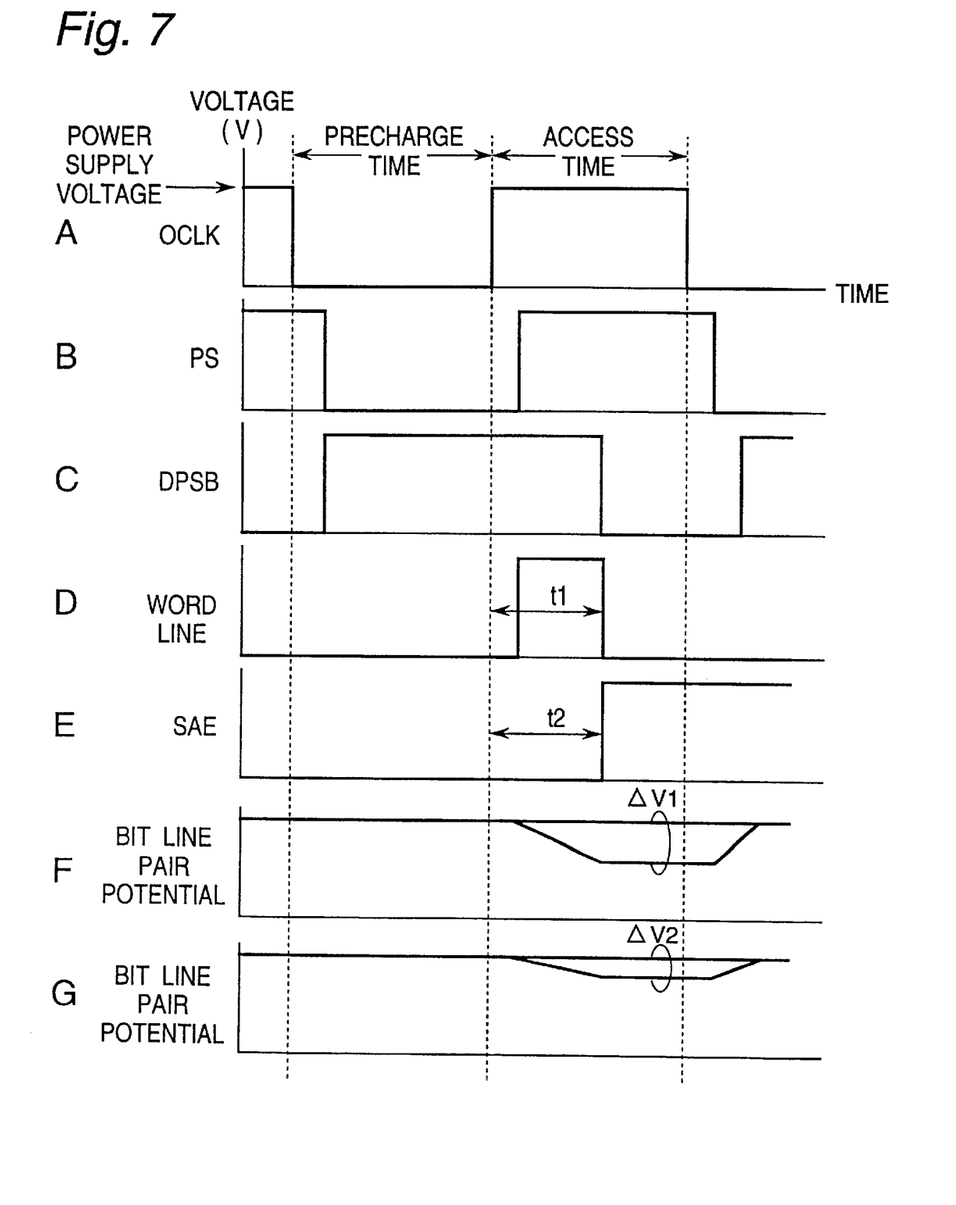
FIG. 7 is a timing chart for illustrating the reading operation of the SRAM in accordance with the present invention.

As the result of the adjustment of the delay time of the first and second delay circuits 52 and 54 in the delay circuit 50, the timing for deactivating the word line and the timing for enabling the sense amplifier are the same as shown in FIG. 7 (namely, $t_1=t_2$). Furthermore, the signal SAE rises up when the potential swing amplitude $\Delta V2$ on the bit line pair 15 and 17 outputted from the bit line selection circuit 20 (namely, the potential difference $\Delta V2$ between the pair of bit lines 15 and 17) becomes equal to the minimum operating voltage of the sense amplifier.

Thus, in the SRAM shown in FIG. 5, the power consumption of the memory cell array 10 is reduced, and simultaneously, the reading speed is elevated.

In the above mentioned embodiment, since the potential swing amplitude on the bit line pair became about 50% of that in the prior art circuit shown in FIG. 1, the consumed current $I_{cell}$ in the memory cell array in the reading operation was reduced by about 50%. Therefore, assuming that the current consumed by the portions other than the memory cell array is expressed by $I_{etc}$, the whole consumed current $I_{RAM}$ of the SRAM in the prior art can be expressed as follows;

$$I_{RAM}=I_{etc}+I_{cell}, I_{etc}=I_{cell}=0.5\times I_{RAM}$$

On the other hand, the whole consumed current $I_{SRAM}$ of this embodiment of the SRAM in accordance with the present invention can be expressed as follows:

$$I_{SRAM}=I_{etc}+0.5\times I_{cell}, \text{therefore, } I_{SRAM}=0.75\times I_{RAM}$$

Accordingly, the embodiment of the SRAM in accordance with the present invention can reduce the whole consumed current of the SRAM by about 25%.

Furthermore, according to this embodiment, the reading speed could be elevated by about 20% in comparison with the prior art, by optimizing the enabling timing of the sense amplifier.

According to the present invention, the following advantages can be obtained:

(1) Since the potential swing amplitude on the bit line pair is caused stop at ΔVmin which the minimum operating condition of the sense amplifier, the consumed current of the memory cell array can be limited to a minimum degree, so that the whole power consumption of the SRAM can be reduced.

(2) Since the timing of the generation of the signal SAE is made consistent with the moment that the potential swing amplitude on the bit line pair reaches ΔVmin, it can be designed to optimize the enabling timing of the sense amplifier operation, so that the reading speed of the SRAM can be elevated.

(3) Since the number of gates in the delay circuit can be modified by the focused ion beam method, it is possible to easily adjust the off timing of the word line and the on timing of the sense amplifier in the SRAM.

(4) In an actual designing of the SRAM, after a circuit is designed by simulation, the SRAM is actually formed on the chip in trial, and then, evaluated. In this procedures, if a desired characteristics concerning the reading speed and the power consumption is obtained by changing the number of gates in the delay circuit by means of the focused ion beam method and by conducting the elevation, it is possible to complete the designing. Therefore, it is possible to develop a low power consumption, high speed SRAM with a short TAT (development time).

The invention has thus been shown and described with reference to the specific embodiments. However, it should be noted that the present invention is in no way limited to the details of the illustrated structures but changes and modifications may be made within the scope of the appended claims.

What is claimed is:

1. A memory reading circuit for reading data from a memory cell array composed of a number of SRAM cells arranged in the form of a matrix, by means of a sense amplifier for differentially amplifying a potential difference between a pair of complementary bit lines, wherein the memory reading circuit generates a signal for deactivating a word line activating the SRAM cells on the same line and a signal for enabling said sense amplifier, on the basis of the same reference signal; and including a first timing adjusting means for adjusting the timing of said first mentioned signal for deactivating the word line and a second timing adjusting means for adjusting the timing of said second mentioned signal for enabling said sense amplifier.

2. A memory reading circuit claimed in claim 1 wherein said second timing adjusting means adjusts the timing of said second mentioned signal for enabling said sense amplifier so that the potential swing amplitude of said potential difference between the pair of complementary bit lines becomes a minimum operating voltage of said sense amplifier.

3. A memory reading circuit claimed in claim 2 wherein said first timing adjusting means and said second timing adjusting means are adjusted to make the timing of said first mentioned signal for deactivating the word line activating the SRAM cells on the same line and the timing of said second mentioned signal for enabling said sense amplifier, consistent with each other.

4. A memory reading circuit claimed in claim 3 wherein at least one of said first timing adjusting means and said second timing adjusting means includes a plurality of gates cascade-connected by interconnection.

5. A memory reading circuit claimed in claim 4 wherein the number of the cascade-connected gates can be adjusted.

6. A memory reading circuit claimed in claim 5 wherein the number of the cascade-connected gates can be adjusted by disconnecting or connecting said interconnection by a focused ion beam.

7. An SRAM comprising a memory cell array composed of a number of SRAM cells arranged in the form of a matrix, and a memory reading circuit including a sense amplifier for differentially amplifying a potential difference between a pair of complementary bit lines, for reading data from said memory cell array, wherein said memory reading circuit generates a signal for deactivating a word line activating the SRAM cells on the same line and a signal for enabling said sense amplifier, on the basis of the same reference signal; and wherein said memory reading circuit further includes a first timing adjusting means for adjusting the timing of said first mentioned signal for deactivating the word line and a second timing adjusting means for adjusting the timing of said second mentioned signal for enabling said sense amplifier.

8. An SRAM claimed in claim 7 wherein said second timing adjusting means adjusts the timing of said second mentioned signal for enabling said sense amplifier so that the potential swing amplitude of said potential difference between the pair of complementary bit lines becomes a minimum operating voltage of said sense amplifier.

9. An SRAM claimed in claim 8 wherein said first timing adjusting means and said second timing adjusting means are adjusted to make the timing of said first mentioned signal for deactivating the word line activating the SRAM cells on the same line and the timing of said second mentioned signal for enabling said sense amplifier, consistent with each other.

10. An SRAM claimed in claim 9 wherein at least one of said first timing adjusting means and said second timing adjusting means includes a plurality of gates cascade-connected by interconnection.

11. A memory reading circuit claimed in claim 10 wherein the number of the cascade-connected gates can be adjusted.

12. A memory reading circuit claimed in claim 11 wherein the number of the cascade-connected gates can be adjusted by disconnecting or connecting said interconnection by a focused ion beam.

13. An SRAM claimed in claim 8 wherein at least one of said first timing adjusting means and said second timing adjusting means includes a plurality of gates cascade-connected by interconnection.

14. A memory reading circuit claimed in claim 13 wherein the number of the cascade-connected gates can be adjusted.

15. A memory reading circuit claimed in claim 14 wherein the number of the cascade-connected gates can be adjusted by disconnecting or connecting said interconnection by a focused ion beam.

16. An SRAM claimed in claim 7 wherein at least one of said first timing adjusting means and said second timing adjusting means includes a plurality of gates cascade-connected by interconnection.

17. An SRAM, comprising:
   a memory cell array containing a plurality of SRAM cells arranged in the form of a matrix; and
   a memory reading circuit comprising:
   (a) a sense amplifier for differentially amplifying a potential difference between a pair of complementary bit lines, for reading data from said memory cell array; and
   (b) a delay circuit for generating a first signal for deactivating a word line activating the SRAM cells on the same line and a second signal for enabling the sense amplifier when the potential swing amplitude on the pair of complementary bit lines becomes equal to a minimum operating voltage of the sense amplifier.

18. The SRAM claimed in claim 17, wherein the delay circuit generates the first signal and the second signal at the same time.

19. The SRAM claimed in claim 18, wherein the pair of complementary bit lines are outputted through a bit line selection circuit.

20. The SRAM claimed in claim 19, wherein the delay circuit comprises a first plurality of inverters for generating the first signal and a second plurality of inverters for generating the second signal.

21. A method of making an SRAM, comprising:
   forming a memory cell array containing a plurality of SRAM cells arranged in the form of a matrix and a plurality of bit lines;
   forming a sense amplifier connected to the plurality of bit lines;
   forming a delay circuit comprising a plurality of inverters; and
   connecting the inverters such that the delay circuit generates a second signal for enabling the sense amplifier when a potential swing amplitude on a pair of complementary bit lines becomes equal to a minimum operating voltage of the sense amplifier and generates a first signal for deactivating a word line activating the SRAM cells on the same line, at the same time it generates the second signal.

22. The method claimed in claim 21, further comprising a step of evaluating the SRAM operating characteristics prior to the step of connecting the inverters; and
   wherein the step of connecting the inverters comprises disconnecting connected inverters by selectively etching an aluminum interconnection between the connected inverters or selectively forming an aluminum interconnection between unconnected inverters by selective aluminum deposition.

23. A method of operating an SRAM containing a memory cell array containing a plurality of SRAM cells arranged in the form of a matrix and a memory reading circuit containing a sense amplifier for differentially amplifying a potential difference between a pair of complementary bit lines, for reading data from said memory cell array, the method comprising:
   generating a first signal for deactivating a word line activating the SRAM cells on the same line; and
   at the same time, generating a second signal for enabling the sense amplifier when the potential swing amplitude on the pair of complementary bit lines becomes equal to a minimum operating voltage of the sense amplifier.

* * * * *